United States Patent [19]

Denyer et al.

[11] Patent Number: 5,276,400
[45] Date of Patent: Jan. 4, 1994

[54] TEST CIRCUIT FOR IMAGING SENSING INTEGRATED CIRCUITS

[75] Inventors: Peter B. Denyer; David Renshaw, both of Edinburgh, Scotland

[73] Assignee: University of Edinburgh, Edinburgh, Scotland

[21] Appl. No.: 842,113

[22] PCT Filed: Sep. 20, 1990

[86] PCT No.: PCT/GB90/01451
§ 371 Date: Apr. 23, 1992
§ 102(e) Date: Apr. 23, 1992

[87] PCT Pub. No.: WO91/04498
PCT Pub. Date: Apr. 4, 1991

[30] Foreign Application Priority Data

Sep. 23, 1989 [GB] United Kingdom ............... 8921561

[51] Int. Cl.⁵ ............................................. G01R 27/26
[52] U.S. Cl. .................................. 324/158 R; 324/537; 324/501
[58] Field of Search ............. 324/158; 371/15.1, 21.1, 371/22.1

[56] References Cited

U.S. PATENT DOCUMENTS

| | | | |
|---|---|---|---|
| 4,527,115 | 7/1985 | Mehrotra et al. | 324/73 R |
| 4,843,312 | 6/1989 | Hartman et al. | 324/158 R |
| 4,894,605 | 1/1990 | Ringleb et al. | 324/158 R X |
| 5,012,185 | 4/1991 | Ohfuji | 324/158 R |
| 5,057,775 | 10/1991 | Hall | 324/158 R |

FOREIGN PATENT DOCUMENTS

| | | |
|---|---|---|
| 8202603 | 12/1981 | European Pat. Off. . |
| 0223714 | 5/1987 | European Pat. Off. . |
| 62-69671 | 3/1987 | Japan . |
| WO84/02580 | 7/1984 | World Int. Prop. O. . |

OTHER PUBLICATIONS

Proceedings of the IEEE 1989 Custom Integrated Circuits Conference 15-18 May 1989, San Diego, Calif. IEE. Nigh et al. "A Self-Testing ALU Using Built-In Current Sensing" see pp. 2211-2214.
Optical Engineering, vol. 21, No. 5 Sep.-Oct. 1982 Dereniak et al. "Microprocessor-Based Charge Coupled Device (CCD) Test Console." see pp. 942-944.
Asano, Solid State Sensors Continue to Improve Their Image, 11-1988, pp. 64-67, JEE.-Journal of Electronic Engineering No. 263, Tokyo, Japan.

Primary Examiner—Kenneth A. Wieder
Assistant Examiner—Maura K. Regan
Attorney, Agent, or Firm—Bell, Seltzer, Park & Gibson

[57] ABSTRACT

The design and testing of integrated circuits in wafer form for production faults, in the absence of irradiation, is described. This is achieved by fabricating test circuits on each wafer at the periphery of the sensor array. In a preferred arrangement, two test circuits are fabricated on each wafer; one for testing the word lines and the other for testing the bit lines and individual sensing sites. The test circuits are controlled by external signals to input predetermined patterns of data to the array and the array output patterns are compared with the input patterns to assess the level of production faults.

10 Claims, 2 Drawing Sheets

TEST CIRCUIT FOR IMAGING SENSING INTEGRATED CIRCUITS

FIELD OF THE INVENTION

This invention relates to the testing of integrated circuits for image sensing. The invention may be applied to array sensors sensitive to visible and infra-red radiation and to other forms of radiation.

BACKGROUND OF THE INVENTION

Integrated circuit array sensors are difficult to test in production. The desired result is that each sensing site (pixel) should be responsive to the anticipated radiation and should be capable of storing an analogue charge packet for a suitable integration period. This charge packet should then be readable by activating word-lines to enable a row of pixels to be sensed via bit-lines which connect the pixels to sense amplifiers or to other read-out mechanisms at the edge of the sensing array. A typical architecture has horizontal scan-circuit, which controls the read-out of analogue switches or sensors, connected to an output amplifier and buffer.

A complete optical test is awkward to perform when the integrated circuits are in wafer form. It is more convenient to perform this test once the circuits have been separated and packaged. However, it is economically desirable only to package good circuits or those circuits which are most likely to pass the final test. It is possible to assess circuits in the wafer by a preliminary electrical test of the array. This test may include writing charge packets into pixel locations and then executing sensing procedures to determine whether each pixel has successfully stored a packet and whether the word and bit-line mechanisms can successfully access each location. Unfortunately, this can be a long procedure and it is made more difficult if the test includes the analog characteristics of each pixel.

Both the final optical test and the on-wafer electrical test can require specialized test equipment and occupy test times longer than those associated with conventional digital integrated circuit production.

SUMMARY OF THE INVENTION

An object of the present invention is to obviate or mitigate at least one of the aforementioned problems.

This is achieved by recognizing that fabrication of such image sensor arrays results in faults within the pixel sites which are rare and physically scattered. This is largely a result of the very small area of each pixel (typically less than 400 sq. microns) and the yield characteristics of contemporary fabrication processes. Internal faults of this nature in individual pixels are likely to fall within the criterion of product acceptability.

It is, therefore, deduced that catastrophic sensor faults are likely to occur in the word lines, bit-lines or peripheral circuits connected to them. Typically, a word or bit-line fault (an open-circuit failure) will cause a row or column of the sensed image to be in error and faults of this nature are generally not acceptable.

Thus, a solution is achieved by concentrating and testing the integrity of word and bit lines and their associated circuitry using tests that are entirely digital in a conventional sense of digital integrated circuit technology. However, the solution also permits the testing of individual sensing sites. These tests may therefore be performed by equipment and procedures normally used for volume integrated circuit production.

According to one aspect of the present invention there is provided an image sensing integrated circuit (IC) having a sensor array comprising a multiplicity of radiation sensing sites, a plurality of word-lines and a plurality of bit-lines, each sensing site being capable of storing an analog charge packet for a predetermined period, said sensor array being coupled on-board to signal read-out means for providing an output signal from said sensor array, said sensor array being coupled to on-board digital test circuit means disposed at the periphery of the array, said on-board digital test circuit means being responsive to a control signal to generate a digital test signal for testing the integrity of at least one of a plurality of the sensor array bit-lines and a plurality of the sensor array word-lines in the absence of test irradiation on said sensing sites, and on-board monitoring and read-out means coupled to said sensor array for monitoring an output signal from said sensor array corresponding to said digital test signal to output the detected states of the word-lines, bit-lines or individual sensing sites to identify the level of production faults on said IC in the absence of test irradiation.

Preferably, said IC includes comparison means coupled to said on-board monitoring means for comparing said output signal with an input signal to identify the level of production faults in said integrated circuit in the absence of test irradiation.

According to another aspect of the present invention there is provided a method of testing image array sensors at the wafer stage for manufacturing faults, said method comprising the steps of, fabricating said wafer with on-board digital test circuit means located at the periphery of the array, coupling said on-board digital test circuit means to an external signal source, in response to a signal from said external test signal source generating a predetermined input digital test signal from said on-board digital test circuit means, applying said predetermined digital test signal to at least one of a plurality of sensor array bit-lines and a plurality of sensor array word-lines of said sensor array, monitoring an output signal from said sensor array corresponding to said predetermined digital test signal and comparing the input and output signals to identify the level of production faults in said integrated circuit in the absence of test irradiation.

These and other aspects of the present invention will become apparent from the following description when taken in combination with the accompanying drawings in which:

DETAILED DESCRIPTION OF THE PREFERRED EMBODIMENTS

Figure 1:
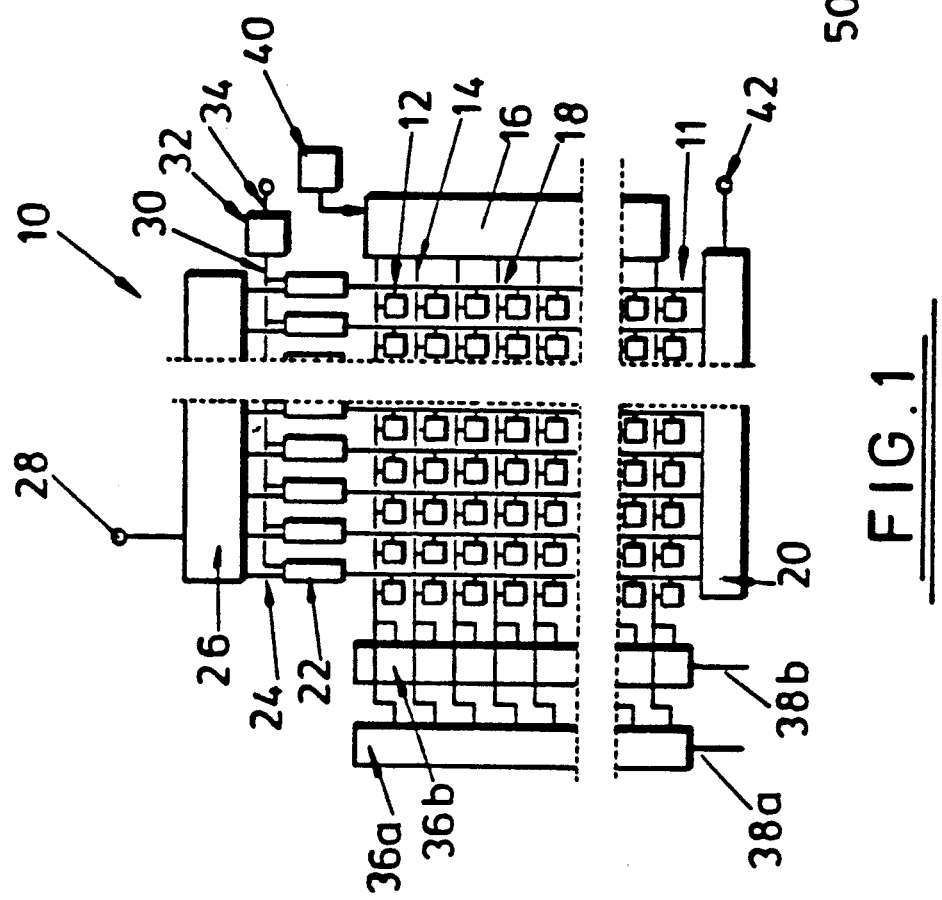
FIG. 1 is a schematic diagram of the architecture of an image sensor array in accordance with an embodiment of the present invention.

Reference is first made to FIG. 1 of the drawings which depicts an image sensor integrated circuit (IC) generally indicated by reference numeral 10. The IC 10 has an image sensing part 11 consisting of an array of sensing sites or pixels 12 arranged in a generally rectangular format. Each horizontal row of pixels 12 is connected by a common-conductor known as a word-line 14 to word-line drive circuit in the form of a shift register 16. Each word-line 14 is also connected to further test pattern detect circuitry 36A and 36B which have respective outputs 38K and 38B from which the output signal can be tested as will be described. Each pixel 12 in a vertical column of pixels is connected to a common conductor known as a bit-line 18 which is connected between a pattern generating drive circuit 20 and sensing amplifiers 22 which are connected in parallel.

Each sensing amplifier 22 has two inputs. The first input 24 of the sensing amplifiers 22 is connected to a read-out circuit 26 which has a pin 28 which can be coupled to a scan drive signal generator (not shown in the interests of clarity). The other input 25 is provided by the bit-line 18 for a column of pixels 12 The output of each amplifier 22 is connected to a common readout conductor 30 which is fed to an output amplifier and buffer 32 which has an output 34 from which a readout signal can be obtained.

The shift register 16 is coupled to a test input signal generator 40 which generates a test input signal in the form of a pattern for loading the word-line drive circuits 16 within the shift register 16 as will be described. Similarly, the pattern generator circuitry 20 has a test signal input 42 through which test input signals in the form of binary high and low states can be applied to the circuit 20 as will also be later described in detail.

Operation of the arrangement shown in FIG. 1 will now be described with reference also to FIG. 2 and to FIG. 3 of the drawings. There are basically three classes of test applied to the sensor array 11.

The first class of test is to verify the integrity of the bit-lines 18 and the associated sensing and read-out circuits 22, 26 and 30. This is achieved by using the pattern generating circuit 20 to drive the bit-lines 18 to high and low states of voltage, current or charge. The normal sense and read-out mechanisms are then employed to output the detected states of the bit-lines 18. Typically, two test patterns, known as test vectors, are used:

1. (Vector 1) provides alternating high and low binary states on consecutive bit-lines 18a, 18b, as best seen in FIG. 2,
2. (Vector 2) provides a complementary pattern of low and high binary states. In this way each bit-line 18a, b is tested in the low and high binary state in opposition to its physical neighbors.

Figure 2:
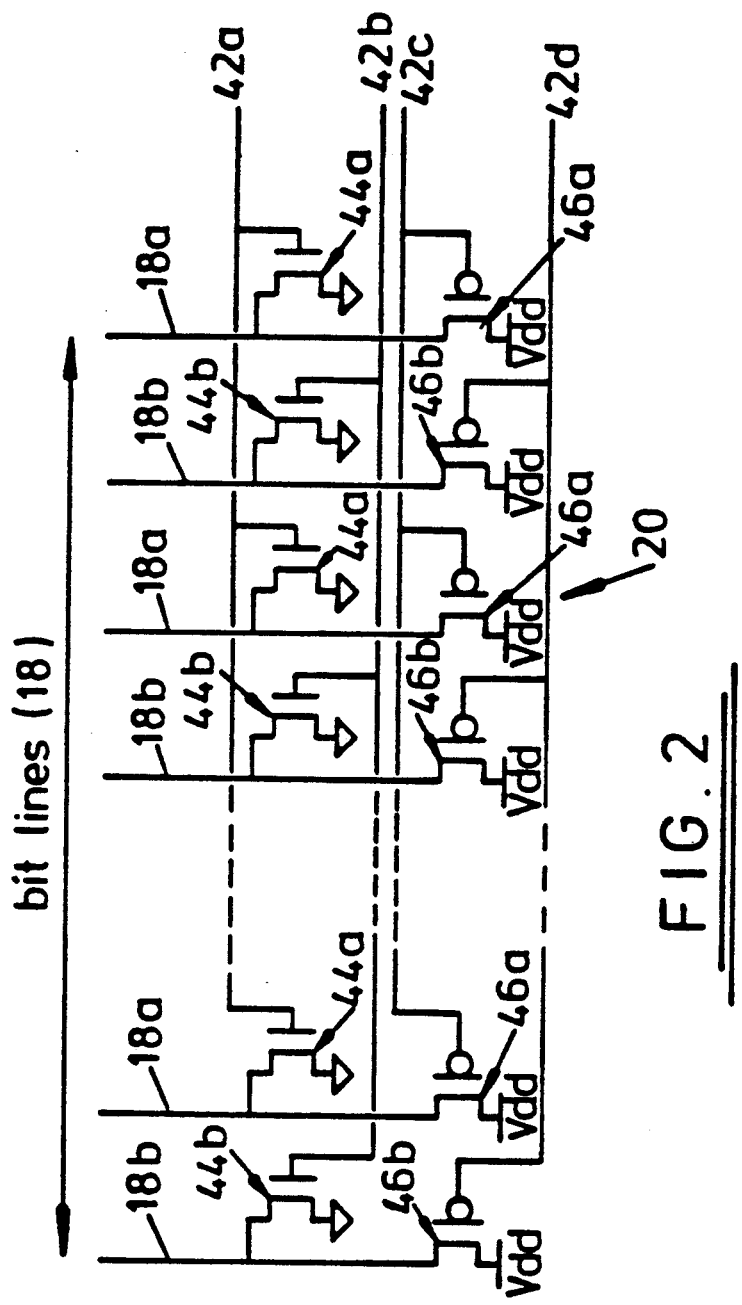
FIG. 2 is a circuit diagram of part of a bit-line test vector generation circuit used in the array shown in FIG. 1.

Reference is now made to FIG. 2 of the drawings which depicts a circuit diagram of the pattern generator 20 shown in FIG. 1. In this embodiment, the drive circuitry for the pattern generator circuit 20 is realized as MOS n and p type pass transistors 44a,b and 46a,b respectively which are connected to each bit-line 18a,b in the arrangement shown. N-type transistors 44a, 44b may be used to drive bit-lines 103a, 103b to a low voltage, whilst p-type transistors 46a, 46b may be used to drive the bit-lines 103a, 103b to a high voltage. Because it is desired to drive alternate bit-lines to opposite levels, the bit-lines are grouped in pairs as 18a, 18b and the pass transistors of each pair are driven by complementary signals on conductors 42a, 42b, 42c and 42d, respectively. Thus, in order to drive bit-line 18a high and bit-line 18b low, the signal on conductor 42a should be low, 42b high, 42c low and 42d high. To subsequently drive bit-line 18a low and 18b high, then line 42a should be high, 42b low, 42c high and 42d low.

The test vector generation circuitry may be inhibited to allow normal operation of the array by setting line 42a low, line 42b low and lines 42c and 42d high. It will be appreciated that line 42 may be driven by external test equipment or decoded from a simpler external signal indicating whether Vector 1 or Vector 2 should be generated or whether the circuit should be inactive.

An advantage of this arrangement is the positioning of the drive and test circuitry 20 at the periphery of the array opposite to the sense and read-out circuits 22, 26 and 32. In this manner, it will be appreciated that the entire length of each bit-line 18 is tested. Therefore, this first class of test covers open and short-circuit bit-line faults and provides a digital functionality check of the sense and read-out circuitry.

The second class of tests is to verify the integrity of the word-lines 14 and the associated drive circuitry 16, 40 and the test circuitry 36a,b. This is achieved using the word-line drive circuitry 16 and the test circuitry 36a, 36b at the periphery of the array to detect certain test patterns. The shift register 16 includes word-line drive circuits which are loaded with certain test patterns by the test input pattern generator 40 and the pattern detector outputs 38a,b are examined to determine whether the expected patterns are being driven on to the word-lines 14. The operation of the array in performing this second class of tests will be better explained with additional reference to FIG. 3 of the accompanying drawings which is a circuit diagram of the pattern detector circuits 36a and 36b.

Each of the detector circuit 36a, 36b includes two distributed dynamic gates 48 and 50, respectively. Gate 48 is a distributed, dynamic NOR gate which provides n-type transistors 52 connected to each respective word-line 14 on which a low voltage (binary zero) is expected. If any of these word-lines are at fault and carry a high voltage (binary 1) then the output 54 of gate 48 will go low signalling a fault. Gate 50 is a distributed dynamic NAND gate which provides p-type transistors 56 connected to every word-line on which a high voltage (binary 1) is expected. If any of these word-lines are at fault and carry a low voltage (binary zero) then the output 58 of gate 50 will go high signalling a fault.

Transistors 60, 62 recharge the outputs of gates 48, 50 respectively and are activated to do so immediately prior to performing the test. Gates 64 combine the results of gates 48 and 50 to provide a single result on output 38 which is high only when the expected pattern is present on the set of word-lines 14.

In order to test for two different vectors, two versions of circuit 38 are required. These versions are shown as 36a and 36b in FIG. 1 and they provide two outputs to be observed, 38a and 38b, respectively. These outputs may be further gated on-chip as desired to provide a single observation point or output.

A particular advantage of this arrangement is the positioning of the test pattern detector circuits 36a, 36b at the periphery of the array opposite to the word-line drive circuit 16 because in this manner the entire length of each word-line 14 is tested.

It will be appreciated that the second class of test, therefore, covers open-word-line faults and provides a digital functionality check of the word-line drive circuitry 108.

Figure 3:
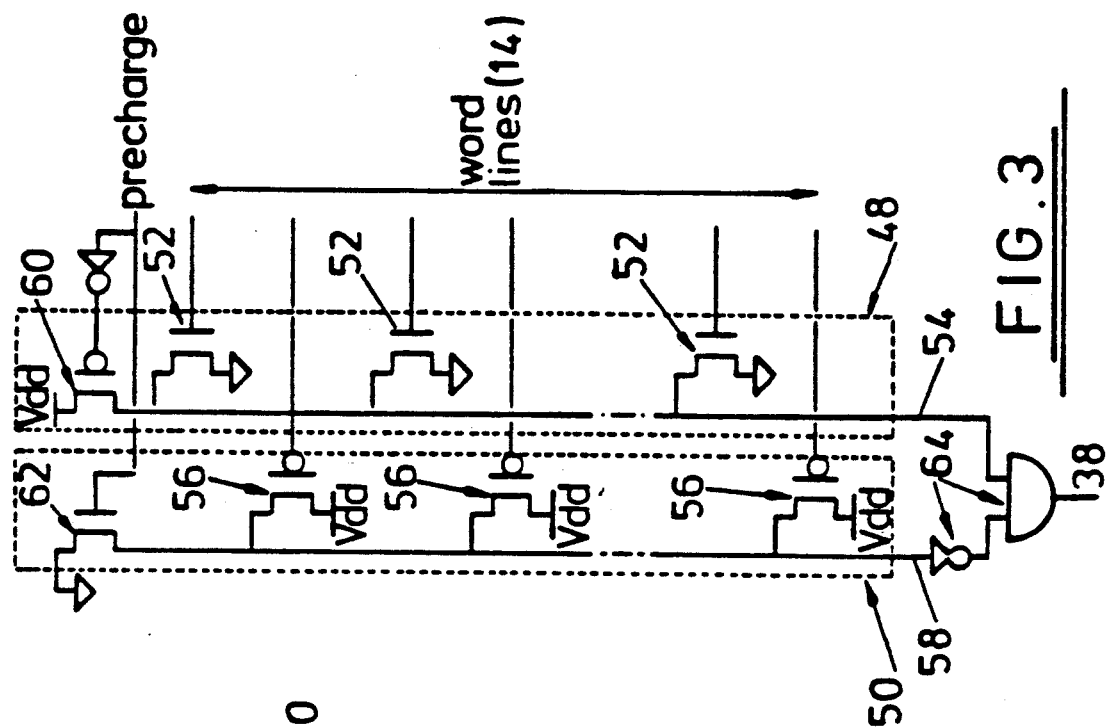
FIG. 3 is a circuit diagram of a word-line pattern detector circuit shown in FIG. 1.

With the circuitry shown in FIGS. 1 to 3, it should be understood that a third class of tests can be applied to test the functionality of individual pixels 12 in the array 10. In this third class of tests the bit-line test vector generator 20 is used to load saturated high or low charge packets into columns of pixels at their normal time of reset. After loading in this way, the row may be subsequently read by scanning in the normal manner and the stream of output pixels tested to determine whether they contain the expected pattern of highs and lows. In this class of tests the bit-line test vector generator is being used to generate a binary pseudo-enrage within the array without requiring any optical input.

It will be appreciated that various modifications may be made to the test circuit hereinbefore described without departing from the scope of the invention. For example, using the bit-line test vector generator shown in FIG. 2,. it is possible to generate many different patterns to test the array, for example, checkerboard and stripe patterns. It is known in practice from dynamic RAM testing that the application of multiple tests of different patterns can assist fault detection. It will also be appreciated that the test patterns can be used cumulativly or individually. For example; the data pattern used to test individual sensing sites can be used independently of the line test for testing the word and/or bit-line. In addition, part or all of the test circuitry may be located on-board and integrated on the array, that is, it forms part of the integrated circuit. The normal output of the pattern tester, i.e. output 34 is located off-board and the line testing circuit is on board, but this could also be off-board. It will be understood that the test circuit hereinbefore described can be applicable to a number of different fabrication technologies such as CMOS, MOS, NMOS, PMOS, BiMOS, BICMOS, Bipolar and amorphous silicon.

In a preferred arrangement the pattern testing is carried out external to the circuit and the line testing is on board. In addition, the pattern detector circuit 36a, 36b is not essential for the circuitry where bit lines only are monitored. The output of the word-lines can be monitored on or off-chip.

The main advantage of the present invention is that integrated circuits containing array sensors can be designed and tested such that techniques of conventional digital integrated circuit production can be used to achieve a high level of production fault testing at the wafer test stage. The circuits then passed for packaging in final tests are likely to be acceptable products. A further advantage is that the circuit arrangement is flexible in that it permits all of the word-lines and bit-lines to be tested and also all of the individual pixel sites and combinations of these to be tested using test circuits which are located on-board.

We claim:

1. An image sensing integrated circuit (IC) having a sensor array comprising a multiplicity of radiation sensing sites, a plurality of word-lines and a plurality of bit-lines, each sensing site being capable of storing an analog charge packet for a predetermined period, said sensor array being coupled on-board to signal read-out means for providing an output signal from said sensor array, said sensor array being coupled to on-board digital test circuit means disposed at the periphery of the array, said on-board digital...test circuit means being responsive to a control signal to generate a digital test signal for testing the integrity of at least one of a plurality of the sensor array bit-lines and a plurality of the sensor array word-lines in the absence of test irradiation on said sensing sites, and on-board monitoring and read-out means coupled to said sensor array for monitoring an output signal from said sensor array corresponding to said digital test signal to output the detected states of the word-lines, bit-lines or individual sensing sites to identify the level of production faults in said IC in the absence of test irradiation.

2. An IC as claimed in claim 1 including comparison means coupled to said on-board monitoring means for comparing said output signal with an input signal to identify the level of production faults in said integrated circuit in the absence of test irradiation.

3. An IC as claimed in claim 1, wherein said digital test circuit means comprises a first test circuit located at the periphery of the array for testing the integrity of the sensor array bit-lines and a second test circuit located at the periphery of the array for testing the integrity of the sensor array word-lines.

4. An IC as claimed in claim 3, wherein said first digital test circuit includes means for testing the integrity of individual sensing sites.

5. An IC as claimed in claim 3 wherein said first and said second test circuits are implemented by shift registers.

6. An IC as claimed in claim 3 wherein said integrated circuit is implemented in one of CMOS, MOS, NMOS, PMOS, BIMOS, BICMOS, Bipolar and amorphous silicon manufacturing technologies.

7. A method of testing image array sensors at the wafer stage for manufacturing faults, said method comprising the steps of,
fabricating said wafer with on-board digital test circuit means located at the periphery of the array,
coupling said on-board digital test circuit means to an external signal source,
in response to a signal from said external test signal source generating a predetermined input digital test signal from said on-board digital test circuit means, applying said predetermined digital test signal to at least one of a plurality of sensor array bit-lines and a plurality of sensor array word-lines of said sensor array, monitoring an output signal from said sensor array corresponding to said predetermined digital test signal and comparing the input and output signals to identify the level of production faults in said integrated circuit in the absence of test irradiation.

8. A method as claimed in claim 7, wherein said method includes the step of fabricating a first on-board digital test circuit at the periphery of the array for testing said plurality of sensor array word-lines and fabricating a second on-board digital test circuit at the periphery of the array for testing said plurality of said sensor array bit-lines, and monitoring respective output signals from said first and second test circuits to assess the level of production faults in said word-lines and said bit-lines respectively.

9. A method as claimed in claim 8, wherein one of said first and second test circuits generates a test signal to test the level of production faults in said individual sensing sites.

10. A method, as claimed in claim 8, wherein said method includes the step of controlling said test circuit means so as to drive the sensor array in one of a number of different signal patterns to optimise detection of production faults.

* * * * *

UNITED STATES PATENT AND TRADEMARK OFFICE
CERTIFICATE OF CORRECTION

PATENT NO. : 5,276,400
DATED : January 4, 1994
INVENTOR(S) : Peter B. Denyer & David Renshaw It is certified that error appears in the above-identified patent and that said Letters Patent is hereby corrected as shown below:

Column 5, line 12, "pseudo-enrage" should be -- pseudo-image --.

Column 5, line 18, after "Fig. 2," delete -- . --.

Column 5, line 24, "example;" should be -- example, --.

Column 3, line 8, "38K and 38B" should be ---- 38A and 38B --.

Column 5, line 35, "BICMOS" should be -- BiCMOS --.

UNITED STATES PATENT AND TRADEMARK OFFICE
CERTIFICATE OF CORRECTION

PATENT NO. : 5,276,400
DATED : January 4, 1994
INVENTOR(S) : Peter B. Denyer, et al It is certified that error appears in the above-indentified patent and that said Letters Patent is hereby corrected as shown below:

Column 5, line 65, after "digital", delete -- ... --.
Column 6, line 28, "BICMOS" should be --BICMOS --.

Signed and Sealed this

Twenty-fourth Day of May, 1994

Attest:

BRUCE LEHMAN

Attesting Officer  Commissioner of Patents and Trademarks